(12) United States Patent
Vermeersch et al.

(10) Patent No.: US 6,290,532 B1
(45) Date of Patent: Sep. 18, 2001

(54) APPARATUS AND METHOD FOR POSITIONING WIRES IN A HIGHSPEED SERIAL DATA CONNECTOR

(75) Inventors: Dean Camiel William Vermeersch, Harrisburg; Julia Anne Lachman, Bernville, both of PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/609,830

(22) Filed: Jul. 5, 2000

(51) Int. Cl.⁷ .................................................. H01R 13/58
(52) U.S. Cl. ........................... 439/460; 439/941; 439/942
(58) Field of Search ........................... 439/941, 942, 439/418, 460, 676

(56) References Cited

U.S. PATENT DOCUMENTS

| | | | |
|---|---|---|---|
| 4,601,530 | * 7/1986 | Coldren et al. | 439/460 |
| 5,571,035 | 11/1996 | Ferrill | 439/894 |
| 5,772,465 | * 6/1998 | Hwang et al. | 439/418 |
| 5,888,100 | * 3/1999 | Bofill et al. | 439/676 |
| 5,967,801 | * 10/1999 | Martin et al. | 439/76.1 |
| 6,123,572 | * 9/2000 | Ishii et al. | 439/465 |

\* cited by examiner

*Primary Examiner*—Tulsidas Patel

(57) ABSTRACT

A method and apparatus for managing and organizing wires in electrical data connectors is disclosed. The method provides the steps to optimally position signal wires in the region where the wires are transitioned between industry standard paired cable signal positions and industry standard attachment positions for a printed circuit board. The apparatus is a data connector forcing the signal wires to maintain optimal positions in the wire transition region and an associated circuit board that eliminates unnecessary unmatched or asymmetrical plated through holes and maintains signal transmission line symmetry.

16 Claims, 5 Drawing Sheets

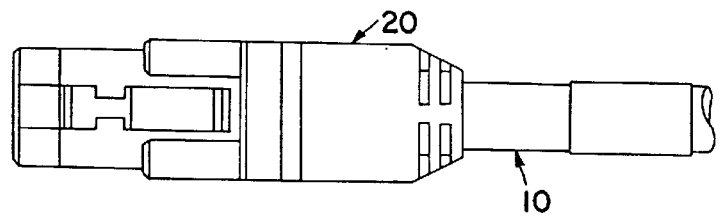
FIG. 1A
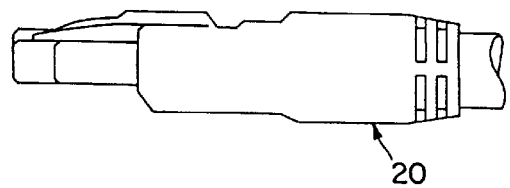
FIG. 1B
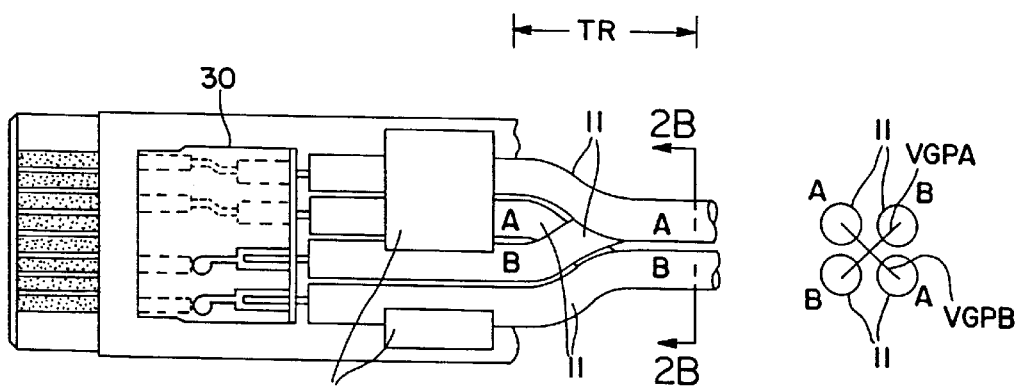
FIG. 2A
FIG. 2B

APPARATUS AND METHOD FOR POSITIONING WIRES IN A HIGHSPEED SERIAL DATA CONNECTOR

FIELD OF THE INVENTION

The present invention relates to an apparatus and a method for organizing and positioning wires in data connectors. More particularly this invention relates to a device and method for controlling the positions of wires in the region where the wires are transitioned between industry standard paired cable signal wire positions and industry standard attachment positions on a circuit board. In a preferred embodiment, the method provides the steps to ensure optimum positioning of the wires as at least one signal wire crosses another signal wire in the transition region. In another preferred embodiment, a connector designed with specific wire routes and sized to maintain optimum positioning of the wires in the transition region and an associated printed circuit board that eliminates unnecessary plated through holes and maintains signal transmission line symmetry are disclosed.

BACKGROUND OF THE INVENTION

In the design of data connectors, the problems of signal cross talk and signal integrity are always at issue. For data connectors used with high speed data rates, in excess of 1.0 gigabit/second, the cross talk and signal integrity problems may be more pronounced.

A problem with current state of the art high speed serial data connectors is two-fold. First, current connector designs used with high speed serial data transmission lines require the transition of industry standard cable wire geometry to an industry standard circuit board attachment geometry. The current primary industry standard cable wire is quad cable. This type of cable is configured as four separate wires twisted around a common center with the two signal lines of a pair being diametrically opposed to each other. In other words, the cross-sectional view of a quad cable would have four wires at the four corners of a square such that the two signal lines of a differential pair are located at the respective opposite corners of the square.

The industry standard geometry for attachment of the conductors to the circuit board is four wires in line and adjacent to each other. The two signal lines of a pair are directly adjacent to each other and are positioned as far from the other pair of signal lines as is possible to reduce potential signal cross talk. As an additional means to reduce cross talk, the two signal line pairs are often separated by a ground line.

The transition in geometry of the signal wires from a twisted quad arrangement to an in-line arrangement requires that one of the signal lines of one of the pairs cross through the signal lines of the other pair. The state of the art of data connectors and the prior art theory provides that crossing one signal line through another pair of signal lines results in unacceptably high levels of cross talk. In view of this belief, current connector designs accomplish the crossing of signal lines in the printed circuit board within the connector.

The cross over of the signal lines in the circuit board is generally achieved by incorporating extra plated through holes or traces for each wire of the signal cable pair. To accomplish the signal line cross over, certain plated through holes will necessarily be unmatched or incorporated into the circuit board in an unsymmetrical geometry. For example, in crossing one signal line over the other signal lines within the circuit board, the paired conductors often use both circuit board ground planes to accomplish the cross over. In these connector designs, unacceptable levels of high near end cross talk, in the range of 5 to 10 percent, are generated.

It has been discovered that use of extra plated through holes, and in particular unmatched or asymmetrical plated through holes are a significant source of cross talk within the printed circuit board. Moreover, unmatched or asymmetric traces and lines leading to the plated through holes are another source of cross talk.

It has also been discovered that the level of cross talk generated when crossing one signal line of paired conductors across the other signal line pair, off of the circuit board, may be minimized if the positioning of the crossing wire is precisely maintained. Unacceptable levels of cross talk are generated primarily when the position of the crossing lines are not maintained in an optimum position or when the lines deviate from an optimum geometry.

While prior art wire and data connector patents have recognized the problem of cross talk, including U.S. Pat. No. 5,571,035, issued to Ferrill, and assigned to The Whitaker Corporation for a Divergent Load Bar; U.S. Pat. No. 4,601,530 issued to Coldren et al., and assigned to AMP, Inc., for an Electrical Connector And Wire Assembly Method, there are no examples known to the Applicant that recognize and resolve the problem of imprecise crossing of signal lines or the introduction of cross talk in a circuit board due to unmatched and asymmetric plated through holes.

Accordingly, it would be desirable to have a method and apparatus for use with or as a data connector that provides a way to minimize signal wire cross talk by optimally transitioning signal cable wires, off of the circuit board, between industry standard geometries and by minimizing signal cross talk in the connector circuit boards by symmetrical design of the circuit boards. Such improvements and results have not been seen or achieved in the relevant art.

SUMMARY OF THE INVENTION

The above noted problems inadequately or incompletely resolved by the prior art are addressed and resolved by the present invention.

A preferred aspect of the invention is a method of managing signal cable wire positions in a data connector, where the signal cable wire has a first and second differential pair of wires, and each differential pair of wires defining a virtual ground plane, the method comprising the step of crossing a first signal wire of the first differential pair through the second differential pair such that the first signal wire is maintained in the virtual ground plane of the second differential pair a minimum distance within the data connector.

Another preferred embodiment of the present invention is an electrical wire connector for transitioning crossed paired cable signal wires onto a circuit board to minimize cross talk between the signal wires, comprising a wire organizer inside the wire connector, the wire organizer holding the cable signal wires and being dimensioned to minimize the distance in the wire connector in which one signal line of a first paired signal wires crosses a second paired signal wires.

Yet another preferred embodiment of the present invention is a wire organizer used within an electrical wire connector for transitioning a first and second crossed paired cable signal wires onto a circuit board to minimize cross talk between the signal wires, the first and second crossed paired cable signal wires defining a respective first and second virtual ground plane, the wire organizer comprising a plurality of channels formed in the wire organizer to receive and maintain the signal wires, wherein a signal line of the first paired signal wires crosses the second paired signal wires such that the first paired signal line is not maintained in the virtual ground plane of the second paired signal wires a minimum distance within the date connector.

Still another preferred embodiment of the present invention is an electrical wire connector for transitioning crossed paired cable signal wires and minimizing signal cross talk, the crossed paired cable signal wires each defining a virtual ground plane, said electrical wire connector comprising a printed circuit board that maintains signal wire symmetry on the board and eliminates unmatched plated through holes within the printed circuit board; and a wire organizer for transitioning the crossed paired cable signal wires onto the printed circuit board, the wire organizer holding the cable signal wires and being dimensioned to force one signal line of a first paired signal wires to cross a second paired signal wires within the connector such that the first signal wire is not maintained in the virtual ground plane of the second differential pair a minimum distance within the data connector.

The invention will be best understood by reading the following detailed description of the preferred embodiments in conjunction with the drawings briefly described below.

BRIEF DESCRIPTION OF THE DRAWINGS

For the purpose of illustrating the invention, the attached drawings show several embodiments and aspects of several embodiments that are presently preferred. However, it should be understood that the invention is not limited to the precise arrangement and instrumentality shown in the accompanying drawings.

FIG. 1A: is a top view of a preferred embodiment of the inventive data connector;

FIG. 1B: is a side view of a preferred embodiment of the inventive data connector;

FIG. 2A: is a top cut-away view of a preferred embodiment of the inventive data connector showing the circuit board and wire organizer sections;

FIG. 2B: is an end view of a preferred embodiment of the inventive data connector showing the positioning of the two differential paired signal lines;

DETAILED DESCRIPTION OF PREFERRED EMBODIMENTS

Figure 3A:
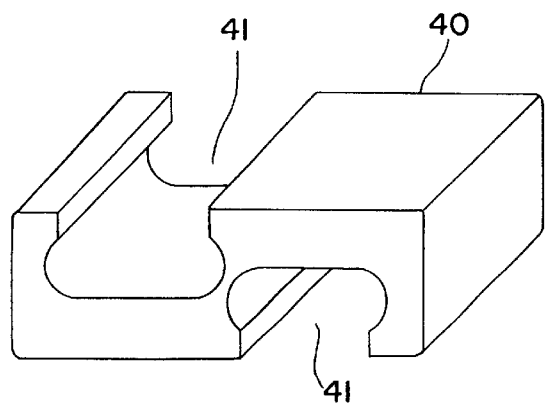
FIG. 3A: is an isometric view of a preferred embodiment of the inventive wire organizer for larger diameter wires.

The present invention provides a method and apparatus for managing and organizing signal wires in a data connector, including on the connector circuit board, to minimize transmission line cross talk and improve signal integrity.

In a preferred embodiment, the present invention provides a method for optimally crossing one signal line of a differential signal pair across another differential signal line pair. Another preferred embodiment of the present invention is a wire organizer that reduces the region within the transition region where the transmission lines may not be in an optimum position, thereby reducing signal line cross talk.

With use of this method and wire organizer apparatus, and as an aspect of the present invention, the data connector circuit board may be designed to minimize asymmetric plated through holes and conductor traces, resulting in a reduction of cross talk within the circuit board.

The current industry standard cable assemblies using copper conductors for high data rates are a quad cable configuration. High data rates are currently considered to be in the range of 1.0 gigabit per second and greater. As previously described, quad cable is configured as four separate wires twisted around a common center with the two signal lines of a pair being diametrically opposed to each other.

As illustrated in FIGS. 1A through 2B, cable 10 comes into connector 20 and the four conductors or wires 11 are repositioned into an in-line or side-by-side configuration of adjacent signal wires as attached to circuit board 30. It is in this transition region, shown in FIG. 2A as "TR", that one signal wire, of a differential pair, must cross the other differential pair signal wires. As labeled in FIGS. 2A and 2B, one wire of the differential conductor pair "B" may cross through differential conductor pair "A", or similarly one wire of the differential pair "A" may alternatively cross through differential pair "B". In either reconfiguring of the wire geometry, at the left side of region TR, the differential pairs "A" and "B" are adjacent to each other and in-line.

It has been discovered that signal wire cross talk is minimized when the distance, or transition region TR, within the connector 20 in which one signal wire of a first differential pair crosses another differential pair is also minimized. The reason for this is that signal wire cross talk is minimized as long as the one crossing signal wire is maintained in the virtual ground plane of the first differential pair. Accordingly, by reducing the region TR in which the wire geometry is reconfigured from a quad geometry to an in-line geometry, signal wire cross talk will be minimized.

The virtual ground plane of a differential pair of signal wires is defined by a line extending between the centers of the paired signal lines and a line perpendicular to center of the first line. As an example, the virtual ground plane of differential pair "A" is shown in FIG. 2B as the line VGPA extending between differential pair "B" that extends into and out of the FIG. Similarly, the virtual ground plane of differential pair "B" would be a line VGPB extending between differential pair "A" that extends into and out of the FIG.

Accordingly, to optimize the positioning of the signal lines in transition region TR and thereby reduce signal line cross talk, one wire of the first signal pair, labeled "A" in FIG. 2B, should be crossed through the other differential pair, labeled "B", in as short a transition region TR as possible. Described alternatively, the one wire of the first signal pair, should be maintained in its respective virtual ground plane for the greatest distance length possible within connector 20 as the geometry of the signal lines is transitioned.

In another embodiment of the present invention, and a physical means of forcing the conductors to transition within the connector 20 and transition region TR in as short a distance as possible, a physical wire organizer 40 may be used within the data connector 20. The wire organizer 40 preferably is dimensioned to fit within the data connector 20 such that limited space is available within the transition region TR for the transition of the conductors from the quad cable geometry to the in-line geometry. By restricting the length of transition region TR, the distance in connector 20 that the crossing conductor is not maintained in its virtual ground plane is minimized and the conductors are thereby held in an optimum position for a majority of the connector length.

Figure 3B:
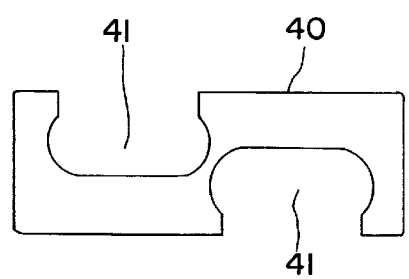
FIG. 3B: is an end view of a preferred embodiment of the inventive wire organizer for larger diameter wires.

An example wire organizer 40 shown in FIGS. 3A and 3B, provides two channels 41 within which wires 11 are seated and which, once seated in place, are maintained in the connector 20. As shown in FIG. 2A, wire organizer 40 holds the wires 11 in a proper position and aligned for attachment to the circuit board 30. Because the wire organizer 40 fills space within the connector 20, the transition region TR, within which the wires 11 must change geometry is reduced. By appropriately sizing the wire organizer 40 and thereby reducing the transition region volume, the wires 11 are forced into the proper or optimum positions such that the one crossing signal conductor is held in its virtual ground plane as long as possible within connector 20. More particularly as shown in FIGS. 2A and 2B, with the wires 11 seated in the wire organizer 40, the area or region TR in which the signal wires transition is minimized.

Because the space inside the connector 20 and within which the wires 11 must transition is reduced, it has been found that in assembling the connector 20, the wire positions are consistently repeated because the wires 11 essentially have one allowable position within the connector 20.

The wire organizer 40, in a preferred embodiment, could be made of a material that provides a limited flexibility to allow for ease of installation and seating of the wires 11 in their respective channels. Also, in another preferred embodiment, the wire organizer 40 could be constructed from an insulating material, such as plastic, thermoplastic, or polyvinyl chloride ("PVC"). However, in another preferred embodiment that is equally effective as a wire organizer, a conducting material could be used for the wire organizer 40.

Figure 4A:
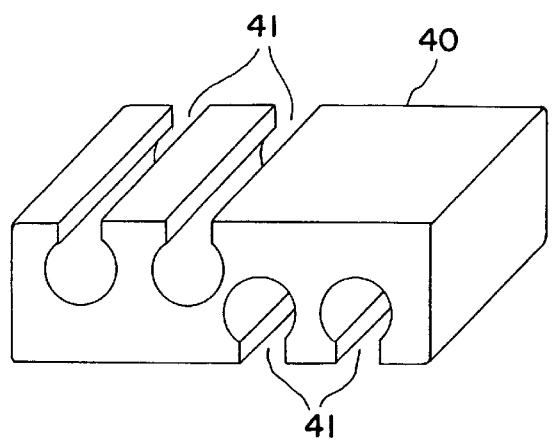
FIG. 4A: is an isometric view of another preferred embodiment of the inventive wire organizer for smaller diameter wires.
Figure 4B:
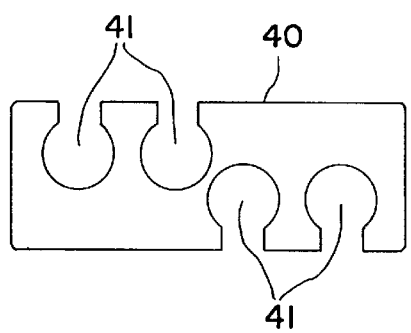
FIG. 4B: is an end view of a preferred embodiment of the inventive wire organizer for smaller diameter wires.

Because different size wires 11 are used for different circuit packages, the wire organizer 40 preferably could be manufactured for different size wires. For example, the embodiment shown in FIGS. 3A and 3B would be appropriate for larger diameter wires 11 which would fit within each channel 41 tightly. For smaller diameter wires, a wire organizer 41, as illustrated in FIGS. 4A and 4B, having separate channels for each wire 11, would be more appropriate to maintain the position of the wires 11 and still maintain the one crossing wire in its virtual ground plane as long as possible within the length of connector 20.

With the ability to transition signal wires from a quad geometry to an in-line geometry without generating unacceptable levels of signal cross talk, the need to complete that transition on the connector printed circuit board is obviated. Because the signal wire transition need not be accomplished on the printed circuit board, the design of the circuit board can be further optimized.

As noted, prior art circuit boards, which transitioned the signal wire geometry on the circuit board induced near end cross talk. It has been discovered that the use on prior art circuit boards of asymmetric traces and unmatched plated through holes are a significant source of signal cross talk.

Figure 5A:
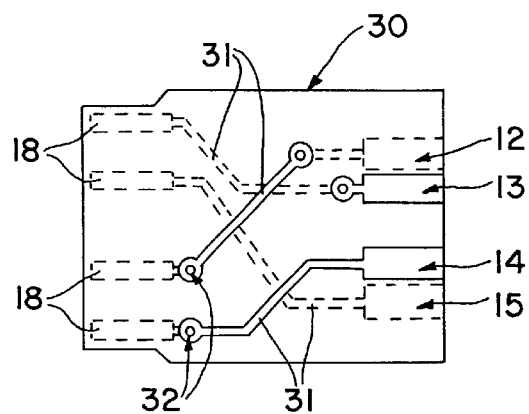
FIG. 5A: is a top view of a typical prior art connector circuit board design showing the upper layer.
Figure 5B:
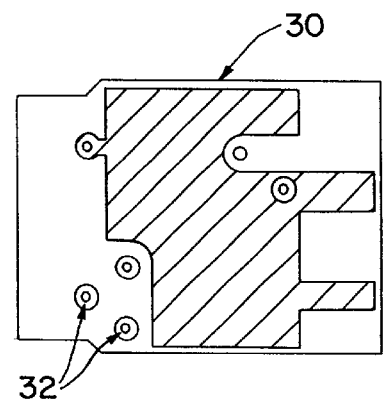
FIG. 5B: is a top view of a typical prior art connector circuit board design showing the lower internal ground plane.
Figure 6A:
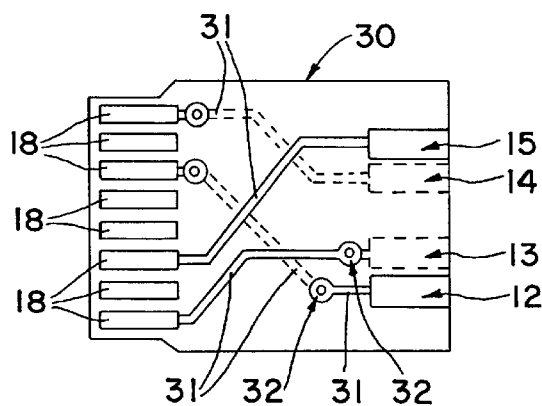
FIG. 6A: is a bottom view of a typical prior art connector circuit board design showing the lower layer.
Figure 6B:
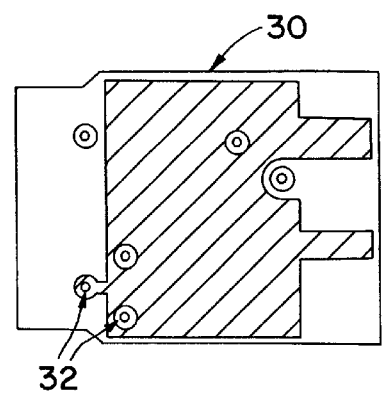
FIG. 6B: is a top view of a typical prior art connector circuit board design showing the upper internal ground plane.

An example prior art connector printed circuit board 30 is shown in FIGS. 5A through 6B. As illustrated, FIG. 5A is the upper layer of a circuit board, while FIG. 6A is the lower layer, as viewed from the bottom, of a circuit board. Accordingly, the signal contacts 12 through 15 shown on FIG. 5A are reversed in order as shown in FIG. 6A. Similarly, FIG. 5B is the lower internal ground plane, as viewed from the top, and FIG. 6B is the respective upper internal ground plane, also viewed from the top.

As shown in FIGS. 5A and 6A, the four signals 12 through 15 shown on the right side of the circuit board 30 lead to the eight contacts 18 on the left side of the circuit board 30. The traces 31 in this prior art example for the four signals 12 through 15 are not symmetrical to each other in either geometry or length.

For example, the top two signals 12 and 13 and bottom two signals 14 and 15 shown on the FIGS. 5A and 6A circuit boards are the respective equivalents of differential signal pairs "A" and "B" shown in FIG. 2A. To minimize potential signal cross talk, the two signal lines 12 and 13, and respectively 14 and 15, should have symmetrical traces in both shape and length to each other. Yet the two respective signals have substantially different shapes and lengths.

Moreover, because the prior art circuit boards accomplished the signal wire crossing in the circuit board 30, signal lines 12 and 13, and signal lines 13 and 15 occupy different layers of the circuit board 30 instead of the same layer of the board 30. Because the signals 12 through 15 occupy different layers of the circuit board, but should be on the same layer of the circuit board at the contacts 18, the signals 12 through 15 and respective signal traces 31 necessarily have unmatched plated through holes 32 as shown in FIGS. 5A and 6A. For example, while signals 14 and 15 each have plated through holes 32, as shown in the lower right hand portion of the FIG. 6A circuit board, the plated through holes are not matched and in fact switch the signal trace 31 to different board layers.

Because the crossing or transitioning of the signal wires in the present inventive connector is accomplished off of the circuit board, as described above, there is no need to have crossing signal lines on the inventive circuit board 20. Accordingly, the inventive connector circuit board is designed to have symmetric signal traces 31 and a minimum of unmatched plated through holes 32 on the board.

Figure 7A:
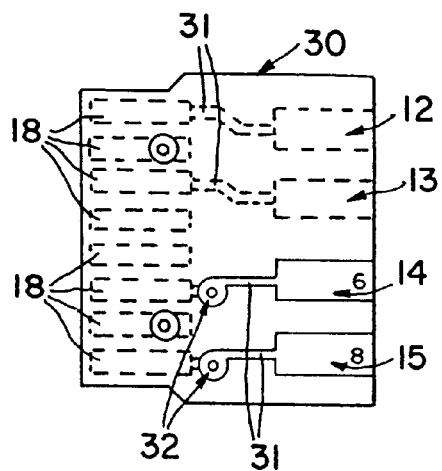
FIG. 7A: is a top view of a preferred embodiment of the inventive connector circuit board design showing the upper layer.
Figure 7B:
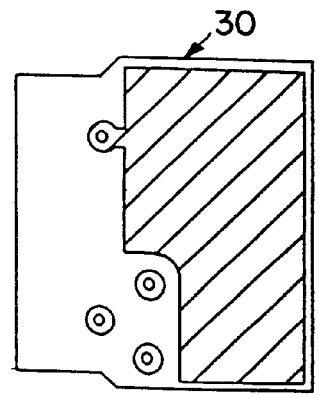
FIG. 7B: is a top view of a preferred embodiment of the inventive connector circuit board design showing the lower internal ground plane.
Figure 8A:
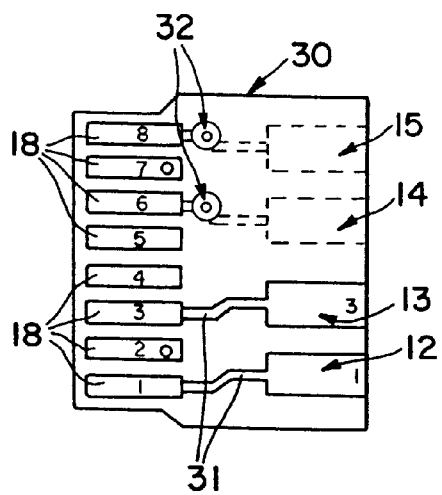
FIG. 8A: is a bottom view of a preferred embodiment of the inventive connector circuit board design showing the lower layer.
Figure 8B:
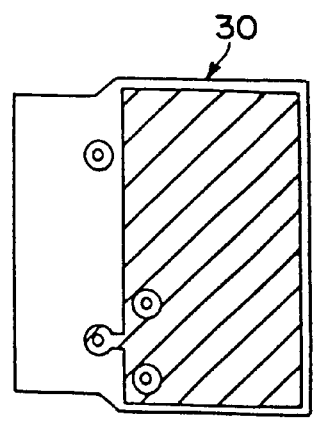
FIG. 8B: is a top view of a preferred embodiment of the inventive connector circuit board design showing the upper internal ground plane.
Figure 9A:
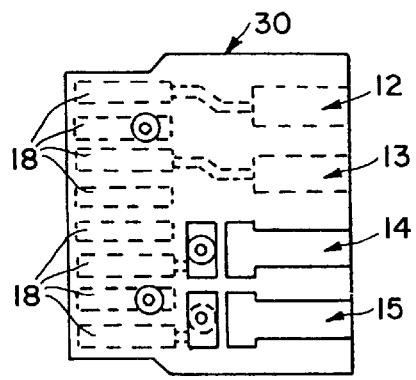
FIG. 9A: is a top view of another preferred embodiment of the inventive connector circuit board design showing the upper layer.
Figure 9B:
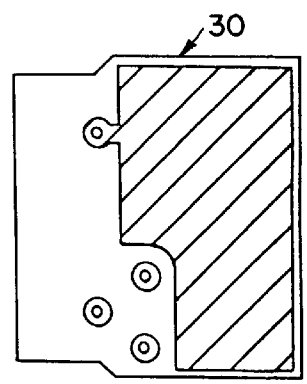
FIG. 9B: is a top view of another preferred embodiment of the inventive connector circuit board design showing the lower internal ground plane.
Figure 10A:
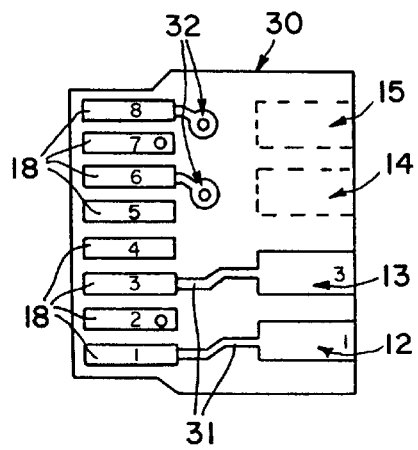
FIG. 10A: is a bottom view of another preferred embodiment of the inventive connector circuit board design showing the lower layer.
Figure 10B:
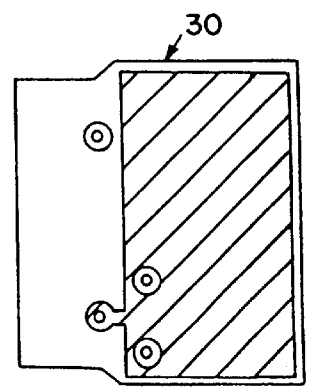
FIG. 10B: is a top view of another preferred embodiment of the inventive connector circuit board design showing the upper internal ground plane.

As shown in FIGS. 7A through 8B, an example design of the inventive circuit board has symmetric signals 12 through 15 and matched plated through holes 32 on the board 20. More particularly, signal contacts 12 and 13 and their respective traces 31, as shown in FIGS. 7A and 8A, are symmetric in shape, geometry and length. The simplicity of the circuit board design, as compared to the prior art board is readily apparent.

Moreover, unlike the prior art board designs, the paired signal contacts may be located on the same layer of the circuit board. That is, as shown in FIG. 7A, signal contact pair 12 and 13 are on the lower layer while the other signal pair 14 and 15 is on the upper layer. Because the respective signal pairs are positioned on the same layer of the board, any crossing of the signal pairs can be accomplished symmetrically or in matched pairs. As shown in the example design of FIGS. 7A and 8A, signal lines 14 and 15 have a matched pair of plated through holes 32. Because the respective signal pair traces are symmetric and there are no unmatched plated through holes on the board, near end cross talk is minimized and signal integrity is improved over the prior art connector circuit boards.

Another example of the inventive circuit board design having symmetrical signal traces 31 and a minimum of unmatched plated through holes is shown in FIGS. 9A through 10B. In this example, as in the FIGS. 7A through 8B example, the signal traces 31 are designed to be symmetrical in shape, length and location on the board 20. Similarly, the signal pairs 12 and 13, and 14 and 15 are respectively located on the same layer of the board 20. Accordingly, signal pair 14 and 15 have matched plated through holes 32, while signal pair 12 and 13 have no need to cross the board and thus have no plated through holes. As in the prior example, near end cross talk on the circuit board is reduced and signal integrity is improved by the simplified design of the board 20.

The above detailed description teaches certain preferred methods and physical embodiments of the present inventive method of managing and organizing signal wires in a data connector and the present inventive data connector, including the connector circuit board, for minimizing signal cross talk and improving signal integrity. While preferred embodiments have been described and disclosed, it will be recognized by those skilled in the art that modifications and/or substitutions are possible and such modifications and substitutions are within the true scope and spirit of the present invention. It is likewise understood that the attached claims are intended to cover all such modifications and/or substitutions.

List of Figure Reference Numerals

10 Signal cable
11 Data transmission wire
12 Signal contact
13 Signal contact
14 Signal contact
15 Signal contact
18 Circuit board output contact
20 Data connector
30 Circuit board
31 Circuit board trace
32 Circuit board plated through hole
40 Wire organizer

What is claimed is:

1. An electrical wire connector for transitioning crossed paired cable signal wires onto a opposing sides of a circuit board to minimize cross talk between the signal wires, comprising a wire organizer inside the wire connector, said wire organizer having a pair of channels each being open to opposite sides along a length of the organizer and each for positioning one of the cable signal wires on one of the opposing sides of the circuit board, the organizer being dimensioned to minimize the distance in the wire connector in which one signal line of a first paired signal wires crosses a second paired signal wires.

2. The electrical wire connector of claim 1, wherein the wire organizer section is constructed of an insulating material.

3. The electrical wire connector of claim 1, wherein the wire organizer is constructed of a conducting material.

4. The electrical wire connector of claim 1, wherein the wire organizer is constructed of a plastic material.

5. The electrical wire connector of claim 1, wherein the wire organizer is constructed of a thermoplastic material.

6. The electrical wire connector of claim 1, wherein wire organizer section is constructed of polyvinyl chloride.

7. A wire organizer used within an electrical wire connector for transitioning a first and second crossed paired cable signal wires onto opposing sides of a circuit board to minimize cross talk between the signal wires, said first and second crossed paired cable wires defining a respective first and second virtual ground plane, said wire organizer comprising a plurality of channels formed in the wire organizer and opening to opposite sides along a length of the wire organizer to receive and maintain the signal wires each on one of the opposing sides of the circuit board, wherein a signal line of the first paired signal wires crosses the second paired signal wires such that the first paired signal line is not maintained in the virtual ground plane of the second paired signal wires a minimum distance within the data connector.

8. The wire organizer of claim 7, wherein the virtual ground plane of a respective crossed paired cable signal wires is a plane defined by a first line between the centers of the first crossed paired cable signal wires and a second line perpendicular to the first line at the center of the first line.

9. The wire organizer of claim 7, wherein the wire connector is used in serial data applications having data transmission speeds in excess of approximately 1.0 gigabit/second.

10. The wire organizer of claim 7, wherein the wire organizer is constructed of an insulating material.

11. The wire organizer of claim 7, wherein the wire organizer is constructed of a conducting material.

12. The wire organizer of claim 7, wherein the wire organizer is constructed of a plastic material.

13. The wire organizer of claim 7, wherein the wire organizer is constructed of a thermoplastic material.

14. The wire organizer of claim 7, wherein the wire organizer is constructed of polyvinyl chloride.

15. An electrical wire connector for transitioning crossed paired cable signal wires and minimizing signal cross talk, said crossed paired cable signal wires each defining a virtual ground plane, said electrical wire connector comprising:

a printed circuit board that maintains signal wire symmetry on the board and eliminates unmatched plated through holes within the printed circuit board; and a wire organizer for transitioning the crossed paired cable signal wires onto the printed circuit board, said wire organizer holding the cable signal wires and being dimensioned to force one signal line of a first paired signal wires to cross a second paired signal wires within the connector such that the first signal wire is maintained in the virtual ground plane of the second differential pair a minimum distance within the data connector.

16. The electrical wire connector of claim 15, wherein the virtual ground plane of a respective crossed paired cable signal wires is a plane defined by a first line between the centers of the first crossed paired cable signal wires and a second line perpendicular to the first line at the center of the first line.

* * * * *

UNITED STATES PATENT AND TRADEMARK OFFICE
CERTIFICATE OF CORRECTION

PATENT NO. : 6,290,532 B1
DATED : September 18, 2001
INVENTOR(S) : Dean Camiel Vermeersch and Julia Anne Lachman It is certified that error appears in the above-identified patent and that said Letters Patent is hereby corrected as shown below:

Column 8,
Line 17, delete "section".
Line 25, insert -- the -- before "wire" (second occurrence).
Line 26, delete "section".

Signed and Sealed this

First Day of October, 2002

Attest:

JAMES E. ROGAN
Attesting Officer      Director of the United States Patent and Trademark Office